(12) United States Patent
Komori et al.

(10) Patent No.: US 11,513,138 B2
(45) Date of Patent: Nov. 29, 2022

(54) SEMICONDUCTOR INSPECTION DEVICE AND PROBE UNIT

(71) Applicant: Hitachi High-Tech Corporation, Tokyo (JP)

(72) Inventors: Masaaki Komori, Tokyo (JP); Katsuo Oki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/261,615

(22) PCT Filed: Jul. 30, 2018

(86) PCT No.: PCT/JP2018/028403
§ 371 (c)(1),
(2) Date: Jan. 20, 2021

(87) PCT Pub. No.: WO2020/026293
PCT Pub. Date: Feb. 6, 2020

(65) Prior Publication Data
US 2021/0263075 A1    Aug. 26, 2021

(51) Int. Cl.
| | |
|---|---|
| *G01R 1/073* | (2006.01) |
| *G01R 31/307* | (2006.01) |
| *G01R 31/28* | (2006.01) |
| *H01B 11/20* | (2006.01) |

(52) U.S. Cl.
CPC ......... *G01R 1/073* (2013.01); *G01R 31/2889* (2013.01); *G01R 31/307* (2013.01); *H01B 11/206* (2013.01)

(58) Field of Classification Search
CPC ................ G01R 31/2653; G01R 31/28; G01R 31/2851; G01R 31/2868; G01R 31/2886;
(Continued)

(56) References Cited

U.S. PATENT DOCUMENTS

| | | | |
|---|---|---|---|
| 6,051,978 | A | 4/2000 | Swart |
| 8,816,712 | B2 | 8/2014 | Nakamura et al. |

(Continued)

FOREIGN PATENT DOCUMENTS

| | | | |
|---|---|---|---|
| JP | 2-184042 | A | 7/1990 |
| JP | 4-206845 | A | 7/1992 |
| JP | 6-258344 | A | 9/1994 |

(Continued)

OTHER PUBLICATIONS

International Search Report (PCT/ISA/210) issued in PCT Application No. PCT/JP2018/028403 dated Oct. 19, 2018 with English translation (four (4) pages).

(Continued)

*Primary Examiner* — Jermele M Hollington
*Assistant Examiner* — Suresh K Rajaputra
(74) *Attorney, Agent, or Firm* — Crowell & Moring LLP

(57) ABSTRACT

Provided is a semiconductor inspection device capable of high-speed response analysis as defect analysis of a fine-structured device constituting an LSI. Therefore, the semiconductor inspection device includes a vacuum chamber 3, a sample table 4 which is disposed in the vacuum chamber and on which a sample 6 is placed, an electron optical system 1 disposed such that an electron beam is emitted from above the sample, a plurality of probe units 24 connected to external devices 11 and 12 disposed outside the vacuum chamber via a coaxial cable 10, and an electrode 5 provided on or in the vicinity of the sample table. The probe unit 24 includes a measurement probe 8 configured to come into contact with the sample, a GND terminal 9 configured to come into contact with the electrode 5, and a probe holder 7 configured to hold the measurement probe and the GND terminal, connect a signal line of the coaxial cable to the measurement probe, and connect a GND line of the coaxial cable to the GND terminal. When the measurement probe of the probe unit comes into contact with the sample, the GND terminal comes into contact with the electrode.

15 Claims, 9 Drawing Sheets

(58) Field of Classification Search
CPC ............ G01R 31/2887; G01R 31/2889; G01R 31/2893; G01R 31/305; G01R 31/307; G01R 1/073; G01R 1/07328; H01B 11/206

See application file for complete search history.

(56) References Cited

U.S. PATENT DOCUMENTS

2003/0042921 A1* 3/2003 Hollman ............ G01R 31/2891
324/750.14
2011/0140729 A1 6/2011 Nakamura et al.

FOREIGN PATENT DOCUMENTS

| JP | 2000-28673 A | 1/2000 |
| JP | 2003-43079 A | 2/2003 |
| JP | 2006-194765 A | 7/2006 |
| JP | 2010-40953 A | 2/2010 |
| JP | 2014-16371 A | 1/2014 |
| JP | 2015-135255 A | 7/2015 |
| JP | 2016-95272 A | 5/2016 |

OTHER PUBLICATIONS

Japanese-language Written Opinion (PCT/ISA/237) issued in PCT Application No. PCT/JP2018/028403 dated Oct. 19, 2018 (five (5) pages).

Taiwanese-language Office Action issued in Taiwanese Application No. 108125240 dated Jul. 6, 2020 with English translation (20 pages).

* cited by examiner

[FIG. 1]
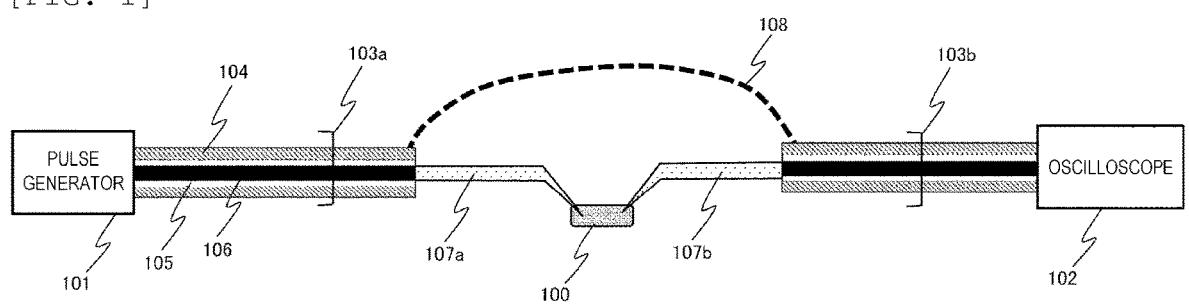

[FIG. 2]
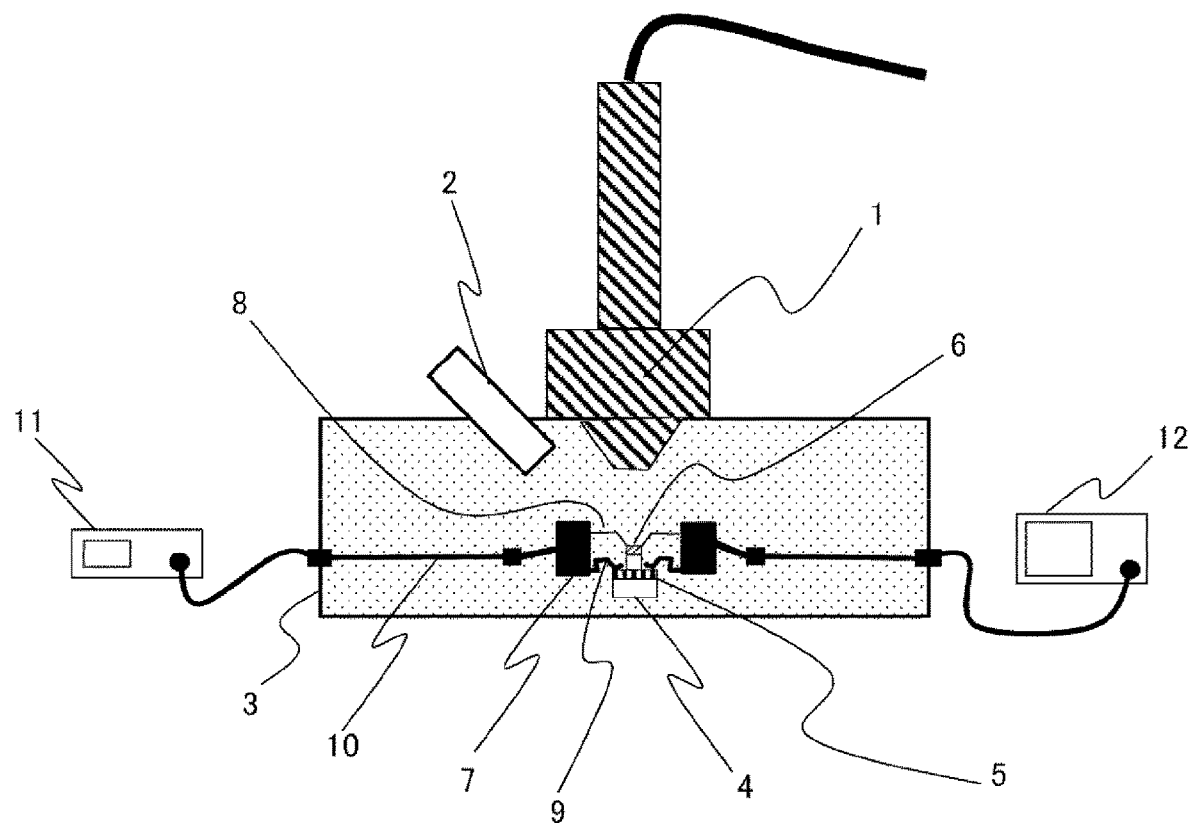

[FIG. 3]
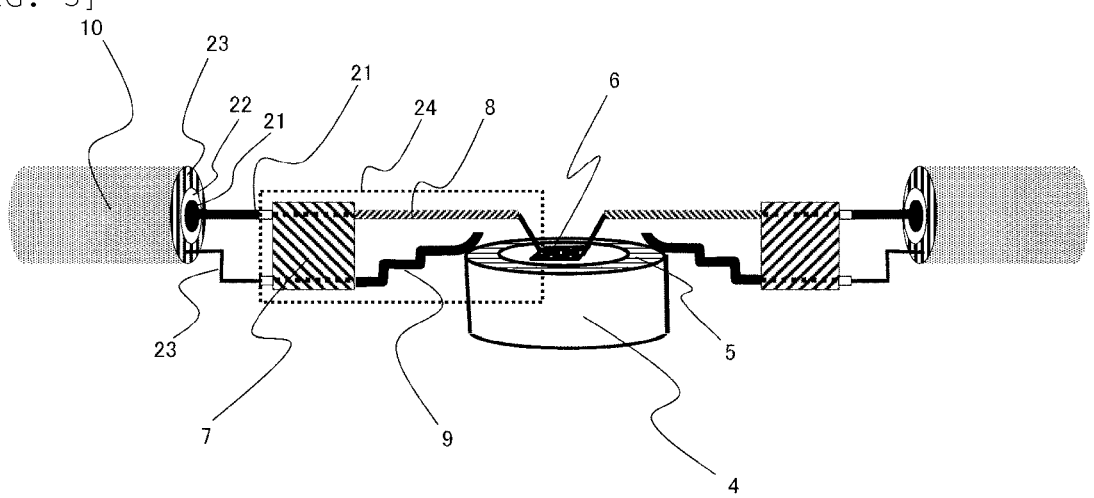

[FIG. 4]
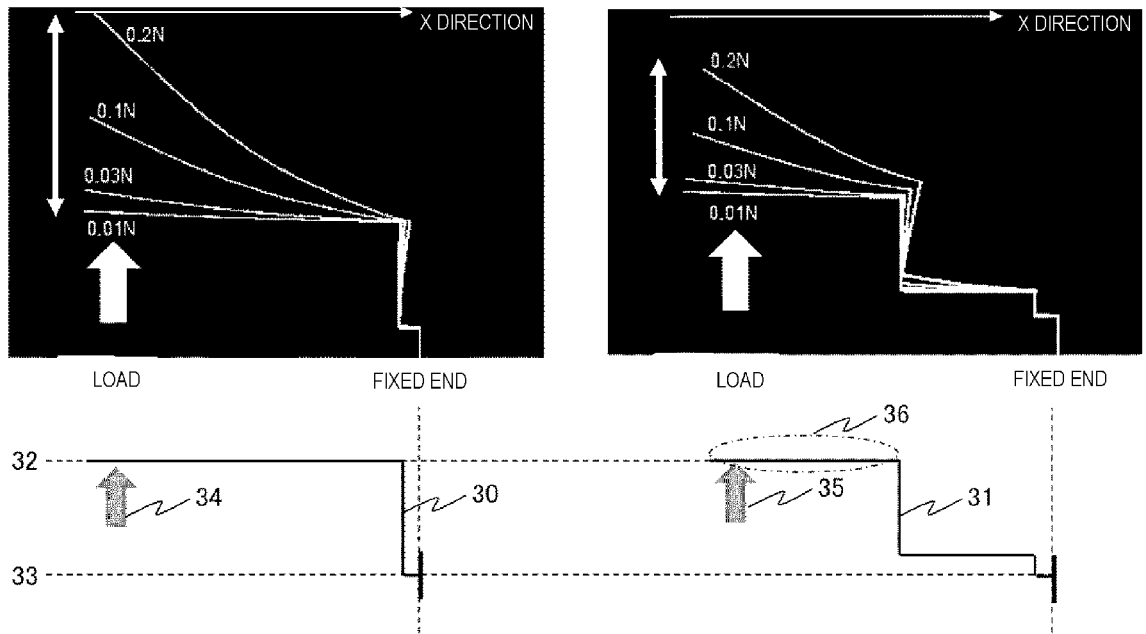
[FIG. 5]
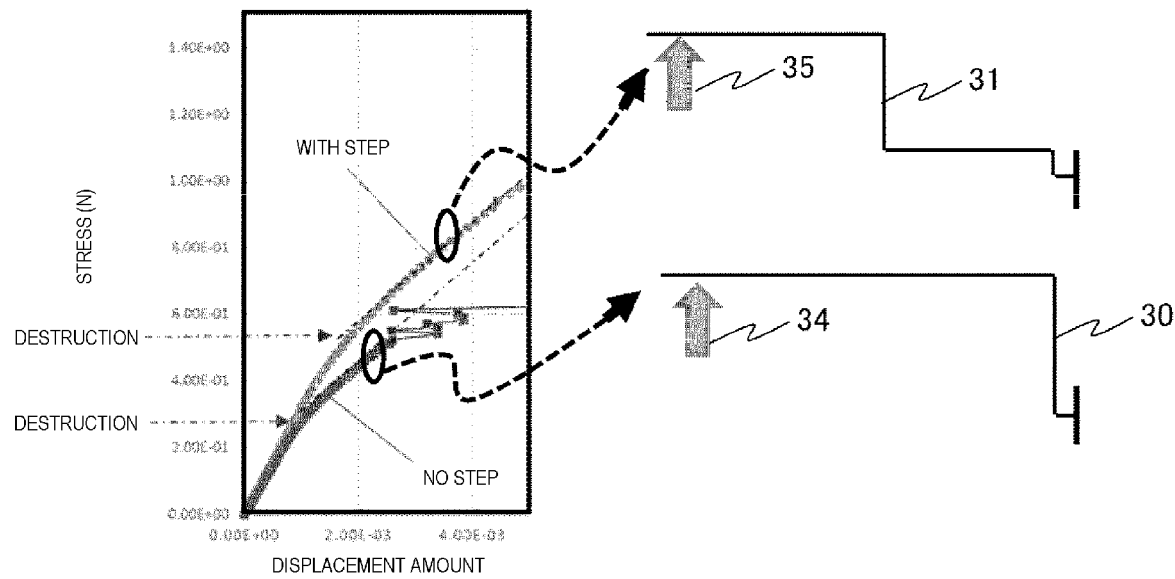

[FIG. 6]
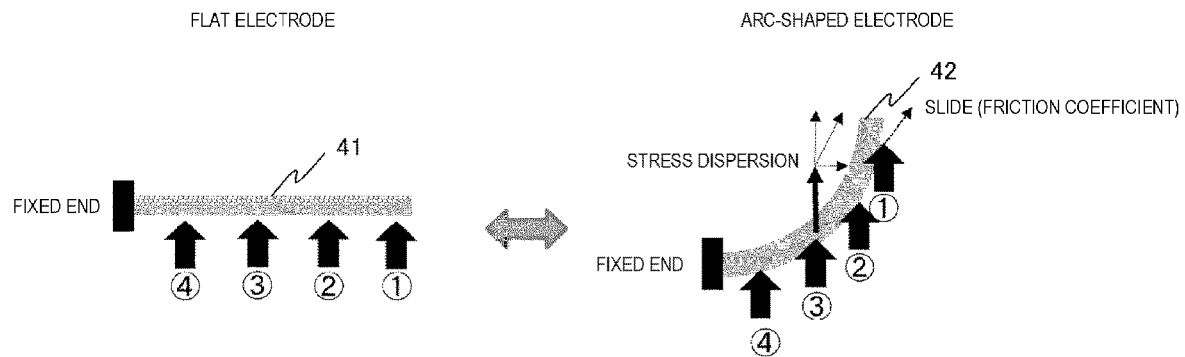
[FIG. 7]
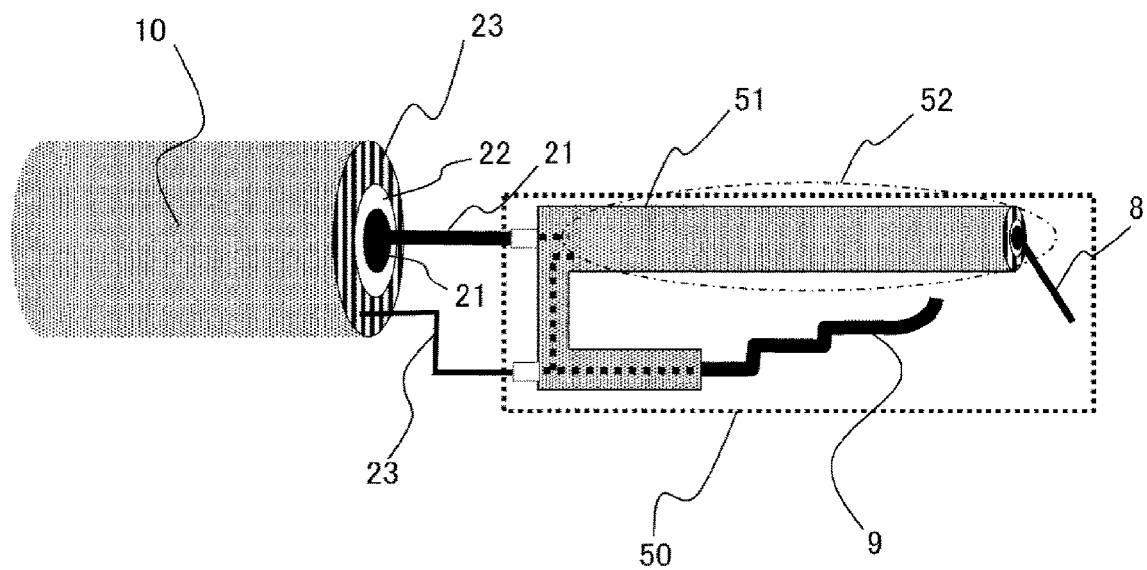
[FIG. 8]
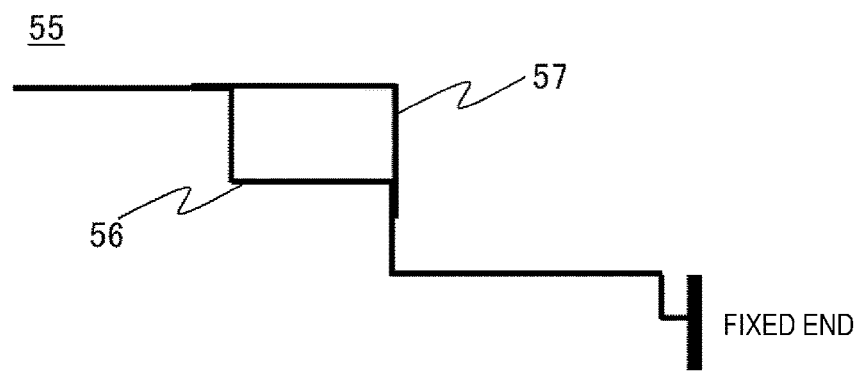

[FIG. 9A]
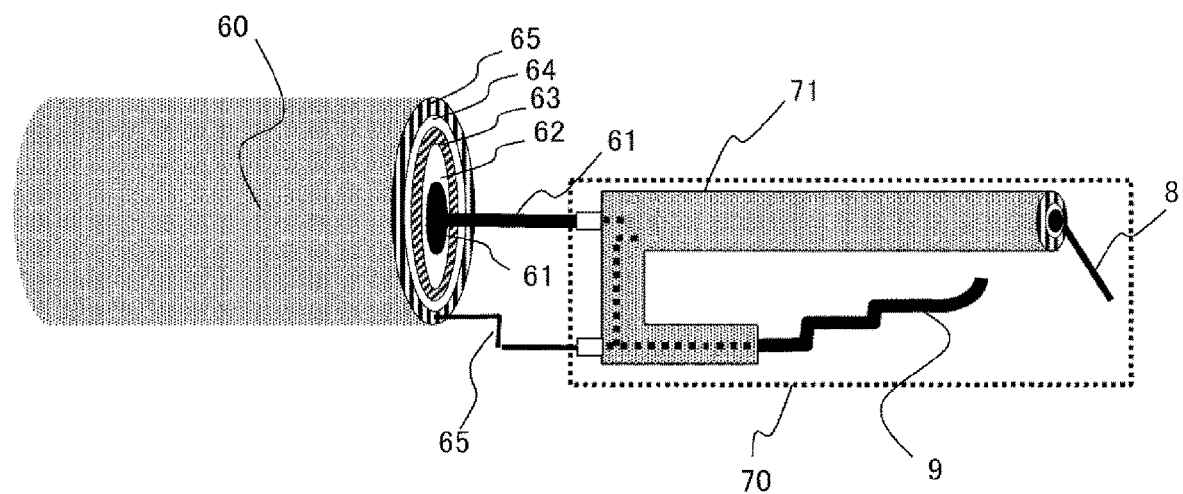
[FIG. 9B]
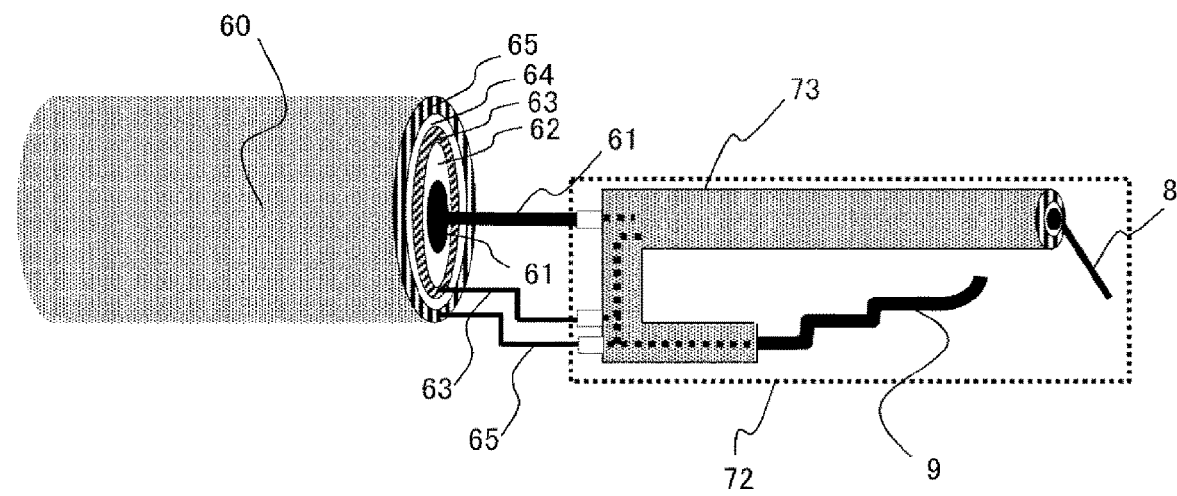

[FIG. 10]
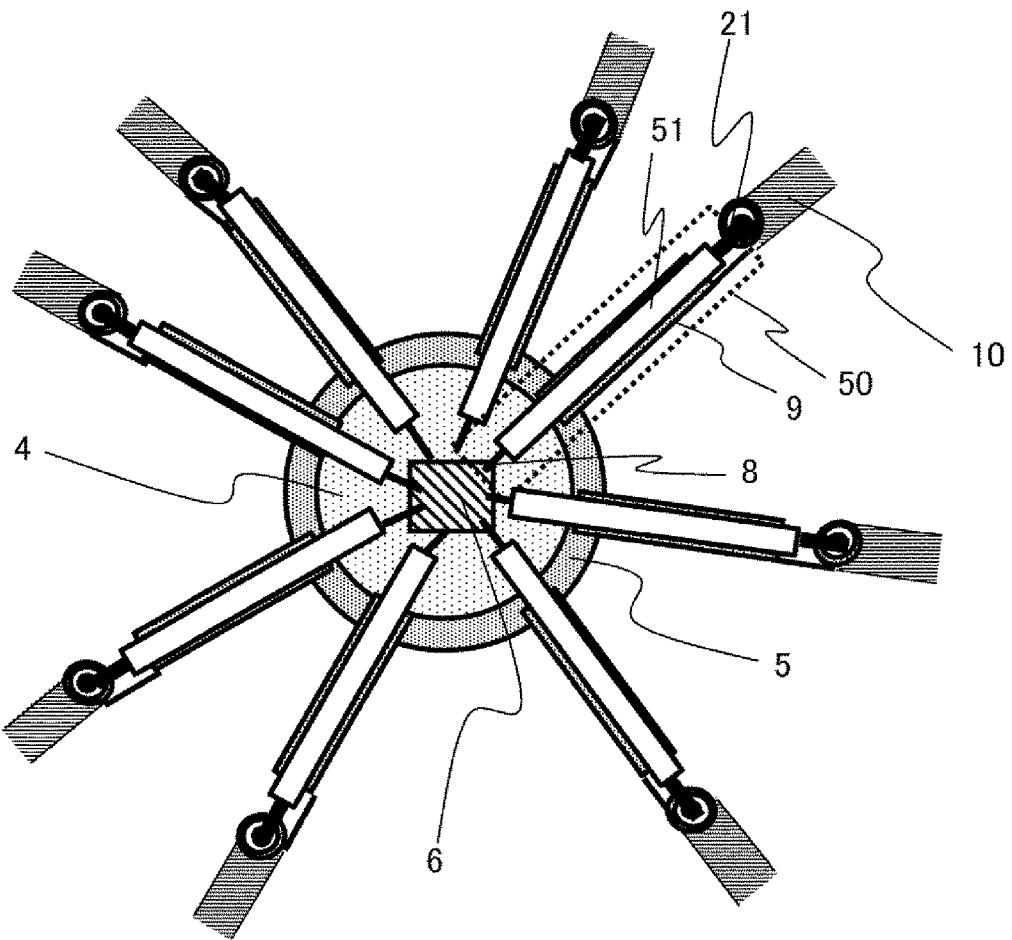
[FIG. 11]
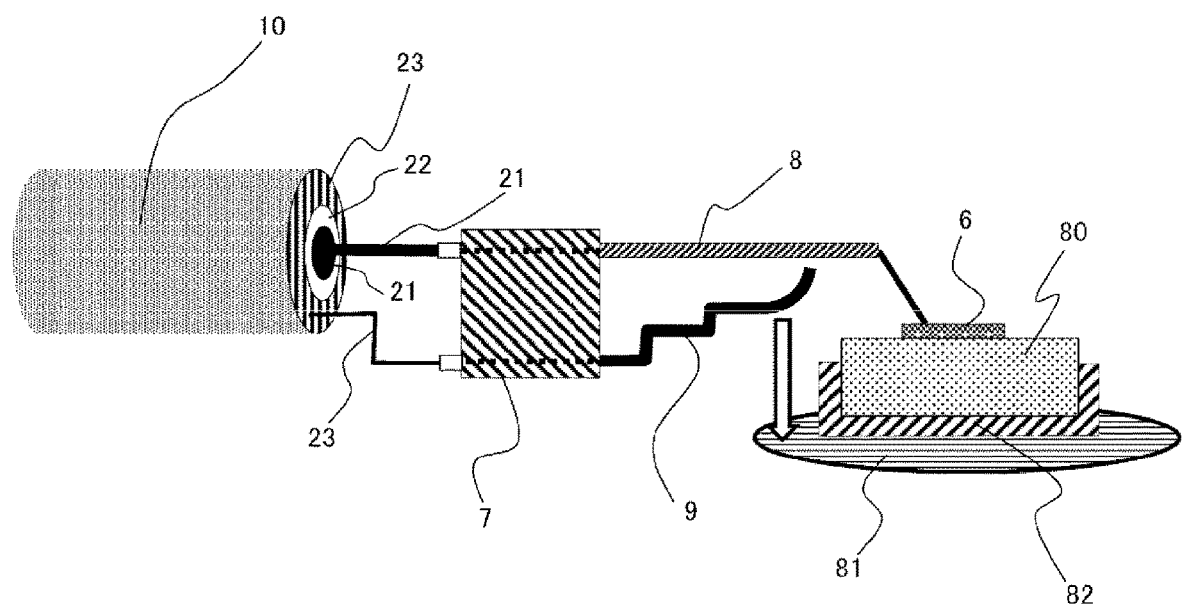

[FIG. 12]
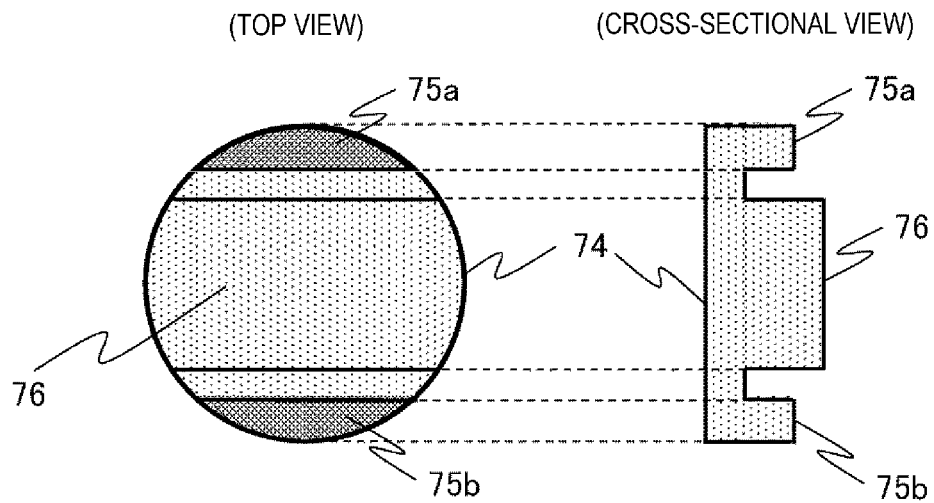
[FIG. 13]
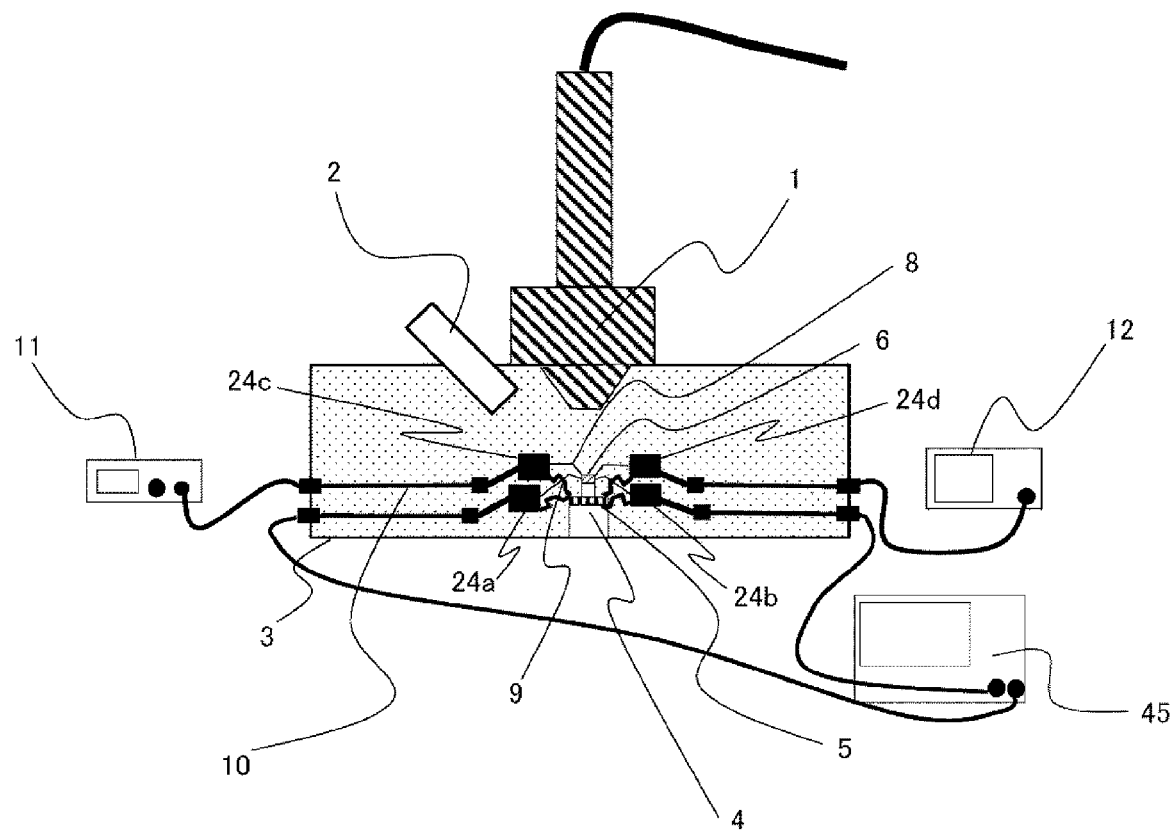

[FIG. 14]
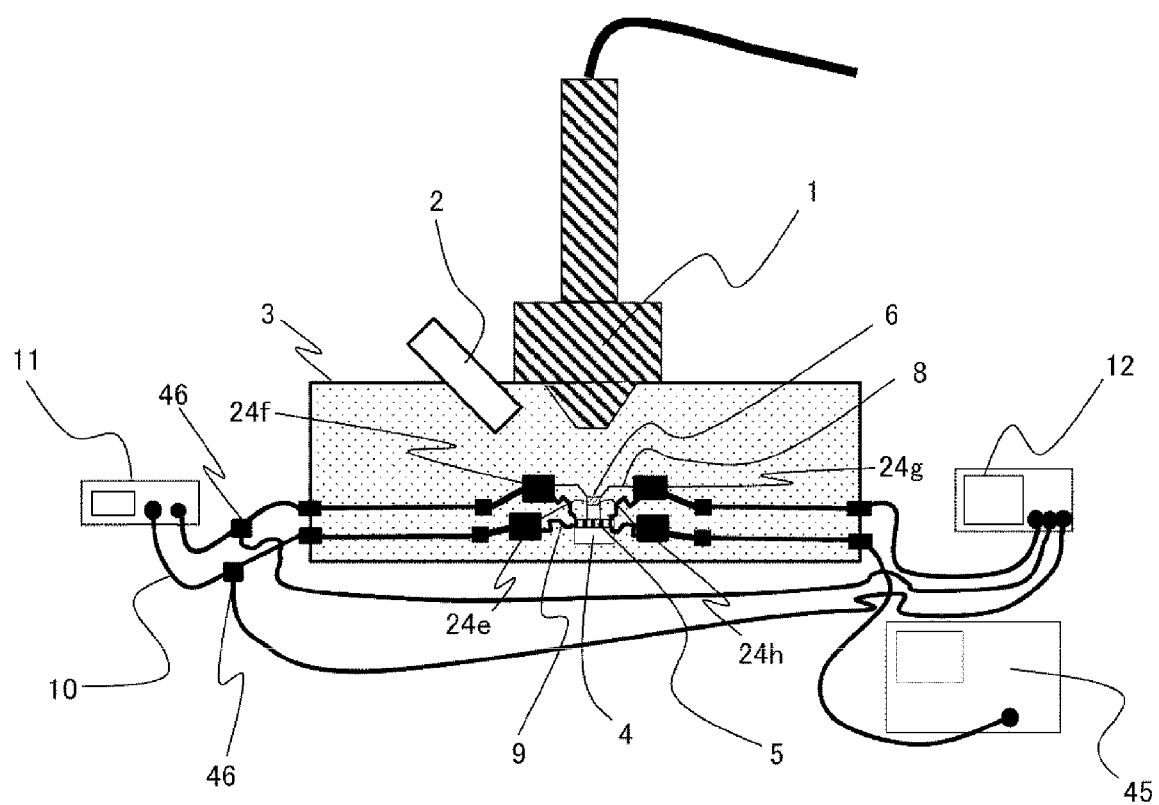

SEMICONDUCTOR INSPECTION DEVICE AND PROBE UNIT

TECHNICAL FIELD

The present invention relates to a semiconductor inspection device, and particularly relates to a fine-structured device characteristics evaluation system using an electron microscope. The invention is particularly useful for defect analysis of a fine-structured device using high-speed dynamic signal response analysis.

BACKGROUND ART

Due to miniaturization of a semiconductor device, a large-scale integration (LSI) has been developed in speed and performance. With such miniaturization of a semiconductor device, the number of transistors, the number of wirings, and the number of contacts increase, and defect analysis of a fault device is more complicated.

A defect analysis method includes a method in which a fairly small probe is directly brought into contact with a contact provided in a fine-structured device (referring to as a fine structure such as an element integrated in the LSI and a wiring formed in the LSI) to evaluate electric characteristics. A device that performs such a defect analysis is called a nanoprober device, and causes the small probe to be brought into contact with the contact in the LSI exposed by surface polishing while observing the fine-structured device with the electron microscope to perform the defect analysis. Recent fine-structured devices having a 10 nm generation process, for example, have been fairly miniaturized, and importance of the nanoprober device is increasing since these nanodevices can be directly evaluated with the nanoprober device.

The evaluation of electric characteristics of the fine-structured device by the nanoprober device is mainly based on direct current measurement. However, improvement of semiconductor device characteristics due to the miniaturization covers not only DC characteristics but also dynamic operating performances. For example, a drive frequency of a device in a central processing unit (CPU) in recent years is 3 GHz or more. Therefore, importance of defect information obtained by high frequency measurement is also increased, and transmission signal evaluation at a higher frequency is desired. The drive frequency (clock frequency of the CPU) is about 3 GHz in a high-performance desktop personal computer, about 1 GHz for a mobile personal computer and a smartphone, and about 10 MHz to 100 MHz in an embedded device.

While the drive frequency of the semiconductor device has increased in this way, a frequency that can be analyzed at a high frequency by the nanoprober device using an electron microscope in the related art has not reached an operating frequency of an actual device. It can be said that a maximum frequency of a high-frequency signal that can be handled by a current nanoprober device is about 10 MHz. When the frequency is below this level, a rectangular pulse waveform can be maintained when a continuous pulse signal is transmitted. Therefore, high frequency analysis using the current nanoprober device can only confirm an actual operation of an embedded device-level device, and is far from a driving environment for the miniaturized fine-structured device. In order to perform high frequency analysis of the miniaturized fine-structured device, it is necessary to implement high frequency transmission of at least 1 GHz.

FIG. 1 shows an example (schematic diagram) of a measurement circuit for performing high frequency analysis using a prober device. A coaxial cable is used for the high frequency analysis. A coaxial cable 103 includes an outer conductor 104 grounded at a reference potential (GND) and a central conductor 106 that transmits a signal. By surrounding the periphery of the central conductor 106 (signal line) with the outer conductor 104 (GND line) via an insulating material 105, external noise to a transmitted high frequency signal is reduced. In the measurement circuit, a pulse generator 101 that generates the high frequency signal is connected to a coaxial cable 103*a*, and the high frequency signal is applied to a sample 100 via a measurement probe 107*a*. The measurement probe 107*a* is in contact with a contact that is an input of the fine-structured device which is a high frequency analysis target by the present measurement circuit. On the other hand, a coaxial cable 103*b* is connected to an oscilloscope 102, and monitors a waveform of a signal from the sample 100 obtained by a measurement probe 107*b* in contact with a contact that is an output of the fine-structured device which is the high frequency analysis target. In order to transmit the high frequency signal in such a measurement circuit, it is necessary to short-circuit GND lines of the opposing coaxial cables 103*a* and 103*b* with a short-circuit line 108. In particular, in order to transmit a signal of a higher frequency, it is necessary to reduce impedance disturbance around a measurement probe 107 as much as possible, and it is desirable that the short-circuit line 108 runs in parallel to the measurement probe 107 as much as possible to make it shorter. This is because the larger a length of the short-circuit line 108 is, the more high frequency characteristics deteriorate. Further, the prober device generally includes a plurality of measurement probes, and measurement using the plurality of measuring probes can be performed. However, when the measurement using the plurality of measurement probes is performed and the length of each short-circuit line 108 is different from each other, the high frequency characteristics will differ depending on the measurement probes, and this difference will appear as a measurement error.

Both PTL 1 and PTL 2 disclose a method of short-circuiting a GND line of a measurement probe in a manual prober device. The manual prober device is a device that measures electrical characteristics by bringing a measurement probe into contact with a surface of a sample observed with an optical microscope. A measurement circuit of each of the nanoprober device and the manual prober device includes a configuration shown in FIG. 1, and there is no difference in a fact that the method of short-circuiting the GND line has a great influence on the measurement of the high frequency characteristics. However, in the manual prober device, unlike probing by the electron microscope as the nanoprober device does, since a size of the contact to be brought into contact is large and the measurement can be performed in the atmosphere, a structural restriction can be said to be smaller than that of the nanoprober device.

In the manual prober, generally, two types of measurement probes of a GND probe connected to a GND line of a coaxial cable and a signal probe connected to a signal line of the coaxial cable are used. The GND probe is brought into contact with a contact of a reference potential provided in a sample, and the signal probe is brought into contact with a contact for signal input and output. In PTL 1, a conductor mesh (short-circuit member) is provided on a sample, and the GND probe and an outer conductor of the signal probe are commonly connected at a position close to a tip of the probe. Further, in PTL 2, a ground spring is provided in the GND probe and is in contact with a ground shield extender provided in the signal probe.

CITATION LIST

Patent Literature

PTL 1: JP-A-6-258344
PTL 2: JP-A-2000-28673

SUMMARY OF INVENTION

Technical Problem

In the nanoprober device having a large spatial and structural constraint, the related art of the manual prober cannot be applied directly. A reason thereof will be described below.

The nanoprober device performs probing measurement by bringing a micro measurement probe into contact with a fine transistor of a nanoorder process while observing a magnified image of a scanning electron microscope (SEM). The measurement probe has a tip diameter of about R10 nm, and a measurement contact that is formed on the sample and is in contact with the measurement probe is also on an order of nanometers. Therefore, the micro measurement probe may be damaged due to collision with the sample caused by unintentional slight vibration during the probing or overload caused by stress fluctuation. Further, even when the measurement probe is exposed to slight vibration after contacting the measurement contact, the measurement probe may be damaged due to the vibration collision with the sample. Therefore, a method of contacting measurement probes twice for the GND short circuit as disclosed in Patent Document 2 increases a risk of damaging the measurement probes.

Further, to perform the observation by the SEM, a structure for the GND short circuit is not a structure that obstructs a traveling path of an electron beam. Therefore, a structure for a GND short circuit as disclosed in PTL 1 cannot be provided on an upper surface of the sample. Further, there is a large spatial restriction since electrical measurement of the sample needs to be performed in a vacuum chamber.

In order to implement the defect analysis device for the semiconductor device using a faster dynamic signal, it is necessary to avoid the spatial and structural restriction peculiar to the nanoprober device as described above and to implement an effective short-circuit structure of the GND line.

Solution to Problem

A semiconductor inspection device according to an embodiment of the invention includes a vacuum chamber, a sample table which is disposed in the vacuum chamber and on which a sample is placed, an electron optical system disposed such that an electron beam is emitted from above the sample, a plurality of probe units connected to an external device disposed outside the vacuum chamber via a coaxial cable, and an electrode provided on or in the vicinity of the sample table. The probe unit includes a measurement probe configured to come into contact with the sample, a GND terminal configured to come into contact with the electrode, and a probe holder configured to hold the measurement probe and the GND terminal, connect a signal line of the coaxial cable to the measurement probe, and connect a GND line of the coaxial cable to the GND terminal. When the measurement probe of the probe unit comes into contact with the sample, the GND terminal comes into contact with the electrode.

Advantageous Effect

The semiconductor inspection device capable of high-speed response analysis as defect analysis of fine-structured devices constituting an LSI is provided.

Other technical problems and novel characteristics will be apparent from the present description and the accompanying drawings.

BRIEF DESCRIPTION OF DRAWINGS

FIG. 1 is an example of a measurement circuit for performing high frequency analysis using a prober device.
FIG. 2 is a configuration diagram of a fine-structured device characteristics evaluation system.
FIG. 3 is a configuration diagram of a probe unit and a sample table.
FIG. 4 is a diagram showing an effect of a stepped shape electrode.
FIG. 5 is a diagram showing the effect of the stepped shape electrode.
FIG. 6 is a diagram showing an effect of an arc-shaped electrode.
FIG. 7 is a modification of the probe unit.
FIG. 8 is a modification of a GND terminal.
FIG. 9A is an example of a tri-axial cable correspondence probe unit.
FIG. 9B is an example of the tri-axial cable correspondence probe unit.
FIG. 10 is a configuration diagram (top view) of the probe unit and the sample table.
FIG. 11 is a modification of a GND electrode.
FIG. 12 is a modification of the GND electrode.
FIG. 13 is a schematic diagram of a fine-structured device characteristics evaluation system according to a first embodiment.
FIG. 14 is a schematic diagram of a fine-structured device characteristics evaluation system according to a second embodiment.

DESCRIPTION OF EMBODIMENTS

A fine-structured device characteristics evaluation system of the present embodiment will be described with reference to FIG. 2. The fine-structured device characteristics evaluation system of the present embodiment is provided with a GND terminal whose contact stress is controlled as a probe structure. The GND terminal is brought into contact with a GND electrode provided on or in the vicinity of a sample table to short-circuit a GND line between measurement probes.

A scanning electron microscope includes an electron optical system 1, a detector 2, and a vacuum chamber 3 as main components thereof. A measurement sample 6 is placed on a sample table 4 in the vacuum chamber 3. A GND electrode 5 is provided on an upper surface of the sample table 4. In a probe unit 24 in the present embodiment, a probe holder 7 connected to a coaxial cable 10 holds a measurement probe 8 and a GND terminal 9. The measurement probe 8 is in contact with the measurement sample 6, and the GND terminal 9 is in contact with the GND electrode 5 on the sample table 4. The probe unit 24 is connected to a driving device (not shown) for moving a sample surface of the measurement sample 6. By an operation of this driving device, the measurement probe 8 comes into contact with a predetermined position of the measurement sample 6, and at the same time, the GND terminal 9 comes into contact with the GND electrode 5. FIG. 2 shows two probe units. The fine-structured device characteristics evaluation system can drive a plurality of probe units which are not limited to two. Further, the vacuum chamber 3 is provided with an anterior chamber (not shown), and the sample table 4 and the probe unit 24 (the probe holder 7, the measurement probe 8, and the GND terminal 9) can be taken out from the vacuum chamber 3 without lowering a degree of vacuum in the vacuum chamber 3.

An operator brings the measurement probe 8 into contact with the measurement sample 6 while observing an electron microscope image obtained by emitting an electron beam to the measurement sample 6 from the electron optics system 1. In the example, a function generator 11 is connected to one measurement probe via a coaxial cable, and an oscilloscope 12 is connected to the other measurement probe by a coaxial cable. An electronic circuit, a measuring device, or the like placed outside the vacuum chamber 3 and connected to the probe unit with the coaxial cable is referred to as an external device in the present description. Accordingly, a high frequency signal output from the function generator 11 is input to the measurement sample 6 through the one measurement probe, and an output signal output in response to the high frequency signal from the measurement sample 6 is transmitted to the oscilloscope 12 through the other measurement probe.

FIG. 3 shows a configuration diagram of the probe unit and the sample table. The coaxial cable 10 has a biaxial structure including a central conductor (signal line) 21, an insulating material 22 surrounding the central conductor (signal line) 21, and an outer conductor (GND line) 23 surrounding the insulating material 22. The outer conductor 23 is set to a reference potential, and a signal is transmitted by the central conductor 21. The signal line 21 of the coaxial cable 10 is connected to the measurement probe 8 by the probe holder 7. Further, the GND line 23 of the coaxial cable 10 is connected to the GND terminal 9 by the probe holder 7. When the measurement probe 8 is in contact with the surface of the measurement sample 6 placed on the sample table 4, the GND terminal 9 is in contact with the GND electrode 5 provided on the sample table 4, so that the GND terminal 9 of each probe unit is short-circuited via the GND electrode 5 of the sample table 4. Accordingly, in an environment specific to a nanoprober device, the GND line between the measurement probes can be short-circuited. The measurement probe 8 is a linear metal and the GND terminal 9 is a plate-shaped metal which gradually wears due to the contact with the measurement sample 6 and the GND electrode 5. Therefore, when the measurement probe 8 and the GND terminal 9 are worn, they can be removed from the probe holder 7 and replaced.

Further, since the sample table 4 is usually set to the reference potential when observation is performed with the electron microscope, the GND electrode 5 can be integrally configured with the sample table 4. In this case, the GND electrode 5 means a contact surface with the GND terminal 9 on the sample table 4. Further, when the measurement probe 8 is brought into contact with a measurement contact of the measurement sample 6, the driving device of the probe unit moves the probe unit down from above (in an optical axis direction of the electron optics system 1) and implements the contact with a predetermined contact pressure. At this time, the GND terminal 9 also needs to be in contact with the GND electrode 5 with a contact pressure equal to or higher than a predetermined value. Therefore, the GND electrode 5 and a sample placing surface (an inner part of the ring-shaped GND electrode) on the sample table 4 are at the same height in FIG. 3. However, a positional relationship between the sample placing surface and the GND electrode 5 is adjusted according to a positional relationship between a distal end portion of the measurement probe 8 and a distal end portion of the GND terminal in the probe unit. For example, a position of the sample placing surface is set higher than a position of the GND electrode 5.

Here, the GND terminal 9 provided in the probe holder 7 has a stepped shape, and more preferably, at least the distal end portion in contact with the GND electrode 5 has an arc shape. This is to make it possible to cope with delicate contact in a nano region. A principle thereof will be described below. FIG. 4 shows displacement simulation results when a load is applied to an electrode 30 having no step structure and an electrode 31 having the stepped shape at positions of arrows 34 and 35, respectively. Electrode lengths of the electrode 30 and the electrode 31 in an X direction are the same. Further, a height 32 is the position of the GND electrode 5 on the sample table 4 in FIG. 3, and a height 33 is a height of a connection position between the GND terminal 9 and the probe holder 7 when the GND terminal 9 is in contact with the GND electrode 5 at a contact pressure of 0.

From the simulation results shown in FIG. 4, it can be seen that a displacement amount is different for the same load (contact pressure). That is, it can be seen that the electrode 31 having the stepped shape between the heights 32 and 33 has a smaller displacement amount than the electrode 30 having no stepped shape despite of the same contact pressure. In order to obtain the reference potential, the GND electrode 5 and the GND terminal 9 need to be brought into contact with each other at an appropriate contact pressure. This displacement control indicates that a desired contact pressure can be obtained by designing the stepped shape of the GND terminal 9 even when the displacement amount of the GND terminal 9 is restricted in use in a limited space around the measurement sample in the vacuum chamber 3. That is, by optimizing the stepped shape, the GND terminal 9 can be set to an optimum contact pressure to the GND electrode 5 while the measurement probe 8 is reduced to a slight displacement amount at which the measurement probe 8 is just in contact with the measurement sample 6. In other words, by setting the GND terminal 9 to the stepped shape, an appropriate contact pressure to the GND electrode 5 can be obtained precisely and independently of the measurement probe 8 regardless of spatial restrictions.

Further, another advantage of the stepped shape will be described. FIG. 5 shows elastoplastic analysis results (simulation results) when the load is applied to the electrode 30 having no step structure and the electrode 31 having the stepped shape at the positions of the arrows 34 and 35, respectively. For each shape, simulation analysis was performed by bilinear approximation using a yield condition of phosphor bronze. A change point of slope in a graph showing a relationship between a displacement amount and stress indicates a displacement amount at which the GND terminal 9 is plastically deformed and cannot be restored when the electrode is displaced by applying the stress. Accordingly, it can be seen that the plastic deformation due to the stress application is reduced when there is the stepped shape. That is, the GND terminal 9 can be prevented from being plastically deformed against some kind of excessive impact caused by an unintended erroneous operation or the like.

Further, it is desirable that the GND terminal 9 has the arc shape. An effect of an arc-shaped electrode will be described with reference to FIG. 6. A figure on the left is a schematic diagram of a state in which displacement is applied to different positions of a flat electrode 41. In this case, stress corresponding to the displacement changes depending on the positions to be displaced. On the other hand, a figure on the right is a schematic diagram of a state in which displacement is applied to different positions of an arc-shaped electrode 42. As compared with a case of the flat electrode 41, a degree of change in the stress corresponding to the displacement and due to the difference in the displaced positions can be reduced because of a surface friction force and dispersion of a force of the arc-shaped electrode 42. Accordingly, even when a contact position of the GND terminal 9 with the GND electrode 5 changes, a change in the contact pressure accompanying the change can be made smaller. When the GND terminal 9 has the stepped shape, a distal end portion 36 (see FIG. 4) of the GND terminal 9 in contact with the GND electrode 5 has the arc shape.

With the structure of the probe unit as described above, the GND line can be short-circuited while avoiding the spatial restrictions specific to the nanoprober device.

A modification of the probe unit structure will be described. Since the measurement probe 8 is a metal wire, the longer the measurement probe 8, the more easily the signal deteriorates. Therefore, in a probe unit 50 shown in FIG. 7, a probe holder 51 includes a connector portion 52 having a coaxial structure for connecting the measurement probe 8. One end of a central conductor of the connector portion 52 is connected to the signal line (the central conductor of the coaxial cable 10) 21, and the other end is connected to the measurement probe 8. Further, an outer conductor of the connector portion 52 is connected to the GND line (an outer conductor of the coaxial cable 10) 23, and is connected to the GND terminal 9. Accordingly, a length of the measurement probe 8 can be reduced as much as possible, and the signal from the signal line 21 can be protected from external noise.

Further, FIG. 8 shows a modification of the GND terminal. A GND terminal 55 is a GND terminal obtained by combining a plate-shaped metal wire 56 and a plate-shaped metal wire 57 having different bending methods. Accordingly, a GND terminal having desired displacement amount-stress characteristics can be created.

Further, in the nanoprober device, in direct current measurement, it is required to measure a micro current on an order of femtoampere. Normally, when a micro DC current is measured with the nanoprober device, a tri-axial cable (triple coaxial cable) is used instead of the coaxial cable. As shown in FIG. 9A, a tri-axial cable 60 includes three axes: a central conductor (signal line) 61, an intermediate conductor (guard) 63, and an outer conductor (GND line) 65. A first insulating material 62 is provided between the central conductor 61 and the intermediate conductor 63, and a second insulating material 64 is provided between the intermediate conductor 63 and the outer conductor 65. When the micro DC current is measured, the intermediate conductor 63 of the tri-axial cable 60 is measured while applying the same potential as the signal line 61 by a measuring device such as a semiconductor parameter analyzer. By keeping the central conductor 61 and the intermediate conductor 63 at equal potentials, a leakage current flowing through the first insulating material 62 is set to 0, and the micro current can be measured accurately.

In contrast, when high frequency measurement is performed, the intermediate conductor 63 and the outer conductor 65 of the tri-axial cable 60 are short-circuited, so to speak, the tri-axial cable is used as the coaxial cable. In the present embodiment, by replacing the probe holder, both direct current measurement and high frequency measurement can be performed. FIG. 9A shows a state in which a probe unit 70 including a probe holder 71 for the direct current measurement is connected to the tri-axial cable 60. The probe holder 71 has the same structure as the probe holder 51 (see FIG. 7), and includes a connector portion having a coaxial structure. One end of a central conductor of the connector portion is connected to the signal line (a central conductor of the tri-axial cable 60) 61, and the other end is connected to the measurement probe 8. Further, an outer conductor of the connector portion is connected to the GND line (the outer conductor of the tri-axial cable 60) 65, and is connected to the GND terminal 9. In contrast, FIG. 9B shows a state in which a probe unit 72 including a probe holder 73 for the high frequency measurement is connected to the tri-axial cable 60. The probe holder 73 includes a connector portion having the coaxial structure. One end of a central conductor of the connector portion is connected to the signal line (the central conductor of the tri-axial cable 60) 61, and the other end is connected to the measurement probe 8. Further, an outer conductor of the connector portion is connected to the GND line (the outer conductor of the coaxial cable 60) 65 and the intermediate conductor 63 of the tri-axial cable 60, and is connected to the GND terminal 9. In this way, by replacing the probe holder to be used according to measurement content, it is possible to easily switch between the micro current measurement and the high frequency measurement without adding an extra structure to the probe unit.

Next, a structure of the GND electrode 5 provided on the sample table 4 will be described with reference to FIG. 10. FIG. 10 is a configuration diagram (top view) of the probe unit and the sample table. In this example, the probe unit 50 including the connector portion of the coaxial structure shown in FIG. 7 is used. The GND electrode 5 provided on the sample table 4 has the ring shape. The nanoprober device brings a large number of measurement probes into contact with the measurement sample as shown in FIG. 10, and measures electrical characteristics thereof. As shown in FIG. 10, the plurality of measurement probes surround the measurement sample 6. By using a ring-shaped electrode as the GND electrode 5, the GND terminal 9 of each probe unit 24 can be contacted in the same state regardless of the contact of the measurement probe 8 from any angle, and in order to measure the electric characteristics, the same high frequency characteristics can be measured regardless of which measurement probe being selected.

In delicate probing in a nano region, a controllable actuator in a nano order using characteristics of a piezo element is driven to bring a fine measurement probe into precise contact with a measurement sample. Not only spatial and environmental constraints of the vacuum chamber, but also an existence of a complicated probing mechanism equipped with the actuator is a spatial constraint around the measurement sample. In particular, in a typical nanoprober device, the plurality of (eight in this example) measurement probes are disposed at the same time as shown in FIG. 10 because preliminary measurement probes are required for a damage risk of the measurement probe. As to be described later, in transistor measurement, at least four measurement probes are required to be brought into contact with one transistor at the same time. In this way, the probing mechanism is densely present around the measurement sample. Therefore, there is little room for space for short-circuiting the GND line, and a superiority of the GND short-circuit structure in the present embodiment will be understood. It is practically impossible to directly apply a mechanism such as a probe for the GND line used in the manual prober to a nanoprober device.

A modification of the structure of the GND electrode 5 will be described with reference to FIG. 11. In FIG. 3, the GND electrode 5 is formed in the ring shape along an outer edge of the sample table 4, and in the example of FIG. 11, a circular-shaped GND electrode 81 is provided on a stage side. Specifically, a sample table receiver 82 is provided on the circular-shaped GND electrode 81. The measurement sample 6 is placed on a sample table 80, and the measurement probe 8 is brought into contact with the measurement sample 6 to measure the electrical characteristics. The sample table 80 is inserted into the sample table receiver 82 and used. When the measurement sample 6 is replaced, the sample table 80 is taken out from the vacuum chamber 3, and the measurement sample 6 is replaced.

Further, even when the GND electrode is provided on the sample table, the invention is not limited to the mode shown in FIG. 3. FIG. 12 is a top view of a sample table 74 including GND electrodes 75a and 75b on an upper surface thereof. In this example, GND electrodes 75 are integrated with the sample table 74. The GND electrodes 75 can be said to be a contact surface with the GND terminal of the sample table 74, and the GND electrodes 75a and 75b are conducted by the sample table 74. When the GND electrode has the ring shape as shown in FIG. 3, a space (sample placing surface) on which the measurement sample 6 is placed is reduced, and the measurement sample 6 may not be placed on the sample table depending on a size of the measurement sample 6. Therefore, as shown in FIG. 12, the GND electrodes 75 face each other at a part of the edge of the sample table 4. Accordingly, a sample placing surface 76 on which the measurement sample 6 is placed can be made large. In this case, the measurement probes are brought into contact from two directions where the GND electrodes 75a and 75b are provided.

First Embodiment

FIG. 13 shows a fine-structured device characteristics evaluation system according to a first embodiment. A semiconductor parameter analyzer 45 is connected by bringing probe units 24a and 24b into contact with the measurement sample 6. The semiconductor parameter analyzer 45 is a measuring device for a parametric test of a semiconductor device such as current-voltage measurement and capacitance measurement, and here, is used to apply a DC voltage to the measurement sample. Instead of the semiconductor parameter analyzer 45, a power supply circuit DC capable of outputting the DC voltage may be used. Further, by bringing a probe unit 24c into contact with the measurement sample 6, the function generator 11 is connected, and by bringing a probe unit 24d into contact with the measurement sample 6, the oscilloscope 12 is connected. The function generator 11 generates a dynamic signal (high frequency signal), and the oscilloscope 12 observes a waveform of a dynamic response signal output in response thereto. The measurement circuit is configured in this way, and for example, failure analysis of a 65 nm generation transistor estimated to be a failure narrowed down from failure diagnosis or the like is performed with an LSI device.

First, a measurement contact of the 65 nm generation transistor is polished until it comes out to a surface. The measurement contact is placed on the sample table 4 as a measurement sample of the fine-structured device characteristics evaluation system, and the measurement probe 8 is brought into contact with the measurement contact. Specifically, the measurement probe 8 is brought into contact with a contact of each of a source, a drain, a gate of the transistor and a substrate. The measurement probes 8 of the probe units 24a and 24b are respectively brought into contact with the drain of the transistor and the substrate, the measurement probe 8 of the probe unit 24c is brought into contact with the gate of the transistor, and the measurement probe 8 of the probe unit 24d is brought into contact with the source of the transistor.

After each measurement probe 8 is brought into contact with each contact of the transistor, 1 V is applied to the drain, 0 V is applied to the substrate, a pulse (1 V) having a width of 5 ns corresponding to 100 MHz is applied to the gate from the function generator 11, and a signal from the source is observed. Transistor failure can be determined by comparing a response waveform from a normal transistor and a response waveform from a defective transistor that can be observed in this way, for example, by comparing a rise time in the response waveform.

Second Embodiment

FIG. 14 shows a fine-structured device characteristics evaluation system according to a second embodiment. In the present embodiment, logic circuit measurement (for example, NAND circuit measurement) is performed.

A signal pulse is input from the function generator 11 to the logic circuit by bringing probe units 24e and 24f into contact with two input terminals of the logic circuit (NAND circuit), respectively. Further, a power supply voltage is applied from the semiconductor parameter analyzer 45 by bringing a probe unit 24h into contact with a power supply terminal of the logic circuit. Instead of the semiconductor parameter analyzer 45, a power supply circuit DC capable of outputting the DC voltage may be used. An output of the logic circuit is monitored by the oscilloscope 12 by bringing a probe unit 24g into contact with the output of the logic circuit. Further, a signal from the function generator 11 is divided in two directions via a splitter 46, one is input to the oscilloscope 12 as a reference signal, and the other is input to the measurement sample 6. In response to changes in the input signal by the function generator 11, in the oscilloscope 12, the signal from the function generator 11 input as the reference signal is NAND calculated and collated with the monitored output signal of the logic circuit (NAND circuit), so that an operation of the logic circuit can be checked.

The invention has been described above using the plurality of embodiments. The invention is not limited to the above-described embodiments and includes various modifications. For example, the above-described embodiments have been described for easy understanding of the invention, and the invention is not necessarily limited to those including all configurations described above. A part of a configuration of one embodiment can be replaced with a configuration of another embodiment, and a configuration of another embodiment can be added to a configuration of one embodiment. Further, a part of a configuration of each embodiment may be added to, deleted from or replaced with a configuration of another configuration.

REFERENCE SIGN LIST 1 electron optical system
2 detector
3 vacuum chamber
4, 74, 80 sample table
5, 75, 81 GND electrode
6 measurement sample
7, 51, 71, 73 probe holder
8 measurement probe
9, 55 GND terminal
10 coaxial cable
11 function generator
12 oscilloscope
21 central conductor (signal line)
22 insulating material
23 outer conductor (GND line)
24, 50, 70, 72 probe unit
45 semiconductor parameter analyzer
46 splitter
52 connector portion
56, 57 plate-shaped metal wire
60 tri-axial cable
61 central conductor (signal line)
62 first insulating material
63 intermediate conductor (guard)
64 second insulating material
65 outer conductor (GND line)
82 sample table receiver
76 sample placing surface
100 sample
101 pulse generator
102 oscilloscope
103 coaxial cable
104 outer conductor (GND line)
105 insulating material
106 central conductor (signal line)
107 measurement probe
108 short-circuit line

The invention claimed is:

1. A fine-structured device characteristics evaluation system using an electron microscope comprising:
a vacuum chamber;
a sample table which is disposed in the vacuum chamber and on which a sample is placed;
an electron optical system disposed such that an electron beam is emitted from above the sample;
a plurality of probe units connected to an external device disposed outside the vacuum chamber via a coaxial cable; and
an electrode provided on or in the vicinity of the sample table, wherein
the probe unit includes a measurement probe configured to come into contact with the sample, a GND terminal configured to come into contact with the electrode, and a probe holder configured to hold the measurement probe and the GND terminal, connect a signal line of the coaxial cable to the measurement probe, and connect a GND line of the coaxial cable to the GND terminal,
the GND terminal is a plate-shaped metal wire having a stepped shape, and
when the measurement probe of the probe unit comes into contact with the sample, the GND terminal comes into contact with the electrode.

2. The fine-structured device characteristics evaluation system using the electron microscope according to claim 1, wherein
the electrode has a ring shape and is provided on the sample table, and the sample is placed inside the ring-shaped electrode.

3. The fine-structured device characteristics evaluation system using the electron microscope according to claim 1, wherein
the electrode has a circular shape, and the sample table is disposed on a sample table receiver provided on the electrode.

4. The fine-structured device characteristics evaluation system using the electron microscope according to claim 1, wherein
a contact surface of the electrode with the GND terminal is provided on a part of an edge of the sample table and faces each other, and
the measurement probe of the probe unit is brought into contact with the sample in a direction in which the contact surface is disposed on the sample table.

5. The fine-structured device characteristics evaluation system using the electron microscope according to claim 1, wherein
the GND terminal is a combination of a plurality of plate-shaped metal wires.

6. The fine-structured device characteristics evaluation system using the electron microscope according to claim 1, wherein
a part of the GND terminal which comes into contact with the electrode has an arc shape.

7. The fine-structured device characteristics evaluation system using the electron microscope according to claim 1, wherein
the probe holder includes a connector portion configured to connect the signal line of the coaxial cable and the measurement probe, and
the connector portion has a coaxial structure.

8. The fine-structured device characteristics evaluation system using the electron microscope according to claim 1, wherein
the coaxial cable is a tri-axial cable, and
the probe holder connects an intermediate conductor and a GND line of the tri-axial cable to the GND terminal.

9. A probe unit of a fine-structured device characteristics evaluation system using an electron microscope configured to bring a measurement probe into contact with a sample placed on a sample table disposed in a vacuum chamber, the probe unit comprising:
a probe holder including a connector portion configured to connect a signal line of a coaxial cable and the measurement probe; and
a GND terminal configured to come into contact with an electrode provided on or in the vicinity of the sample table, wherein
the GND terminal is a plate-shaped metal wire having a stepped shape, and
the GND terminal is attached to the probe holder so that the GND terminal comes into contact with the electrode when the measurement probe comes into contact with the sample.

10. The probe unit of the fine-structured device characteristics evaluation system using the electron microscope according to claim 9, wherein the GND terminal is a combination of a plurality of plate-shaped metal wires.

11. The probe unit of the fine-structured device characteristics evaluation system using the electron microscope according to claim 9, wherein a part of the GND terminal which comes into contact with the electrode has an arc shape.

12. The probe unit of the fine-structured device characteristics evaluation system using the electron microscope according to claim 9, wherein the connector portion has a coaxial structure.

13. The probe unit of the fine-structured device characteristics evaluation system using the electron microscope according to claim 9, wherein the coaxial cable is a tri-axial cable, and the probe holder connects an intermediate conductor and a GND line of the tri-axial cable to the GND terminal.

14. The fine-structured device characteristics evaluation system using the electron microscope according to claim 1, wherein a tip diameter of the measurement probe is about R10 nm.

15. The probe unit of the fine-structured device characteristics evaluation system using the electron microscope according to claim 9, wherein a tip diameter of the measurement probe is about R10 nm.

* * * * *